United States Patent [19]
Huang

[11] Patent Number: 6,157,064
[45] Date of Patent: Dec. 5, 2000

[54] METHOD AND A DEEP SUB-MICRON FIELD EFFECT TRANSISTOR STRUCTURE FOR SUPPRESSING SHORT CHANNEL EFFECTS

[75] Inventor: Jenn Ming Huang, Hsin-chu, Taiwan

[73] Assignee: Taiwan Semiconductor Manufacturing Company Ltd., Hsin-Chu, Taiwan

[21] Appl. No.: 09/391,885

[22] Filed: Sep. 7, 1999

Related U.S. Application Data

[62] Division of application No. 08/990,698, Dec. 15, 1997, Pat. No. 5,989,966.

[51] Int. Cl.$^7$ .................................................. H01L 29/76
[52] U.S. Cl. ........................ 257/344; 257/334; 257/346; 257/408
[58] Field of Search .................... 257/346, 336, 257/344, 408; 438/305, 304, 558, 559, 563, 302

[56] References Cited

U.S. PATENT DOCUMENTS

| | | | |
|---|---|---|---|
| 4,960,723 | 10/1990 | Davies | 438/274 |
| 5,221,632 | 6/1993 | Kurimoto et al. | 438/305 |
| 5,312,768 | 5/1994 | Gonzalez | 438/227 |
| 5,391,508 | 2/1995 | Matsuoka et al. | 438/302 |
| 5,496,750 | 3/1996 | Moslehi | 438/297 |
| 5,518,945 | 5/1996 | Bracchitta et al. | 438/307 |
| 5,710,054 | 1/1998 | Gardner et al. | 438/304 |
| 5,759,885 | 6/1998 | Son | 438/230 |
| 5,898,203 | 4/1999 | Yoshitomi et al. | 257/344 |
| 5,915,182 | 6/1999 | Wu | 438/299 |
| 5,926,715 | 7/1999 | Fan et al. | 438/305 |

*Primary Examiner*—Steven H. Loke
*Assistant Examiner*—Shouxiang Hu
*Attorney, Agent, or Firm*—George O. Saile; Stephen B. Ackerman

[57] ABSTRACT

A method and a deep sub-micron FET structure for suppressing short channel effects and reducing gate-to-drain overlay capacitance and for making CMOS devices is achieved. The method for making these improved FETs includes forming a gate oxide and a patterned polysilicon layer for gate electrodes. Silicon nitride ($Si_3N_4$) first sidewall spacers are formed on the sidewalls of the gate electrodes. After selectively removing the gate oxide adjacent to the first sidewall spacers, second sidewall spacers are formed from a doped oxide that serve as a solid-phase diffusion source. The source/drain contact areas are implanted adjacent to the second sidewall spacers. The substrate is then annealed to diffuse from the second sidewall spacers the lightly doped source/drains (LDDs). The $Si_3N_4$ sidewall spacers serve as a diffusion barrier and the LDDs are formed finder the $Si_3N_4$ spacers contiguous with the FET channel, resulting in reduced gate-to-drain overlay capacitance and improved immunity to hot electron effects. By including three additional masking steps, both N-channel and P-channel FETs can be formed for making CMOS devices.

3 Claims, 5 Drawing Sheets

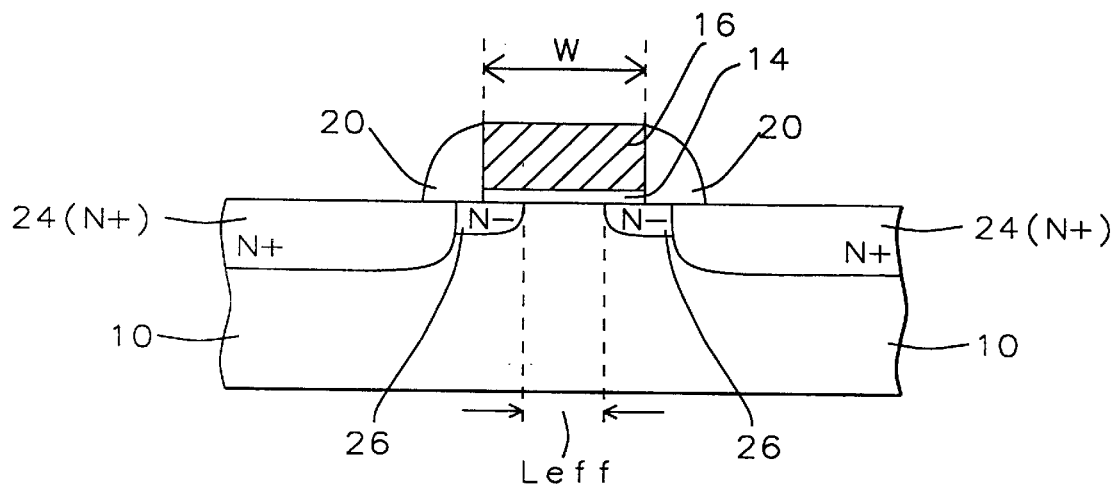
FIG. 1 - Prior Art
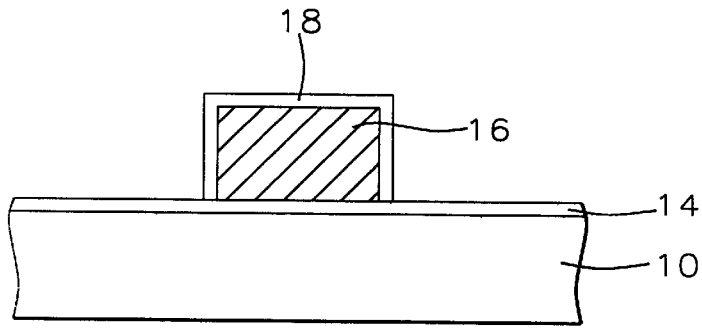
FIG. 2
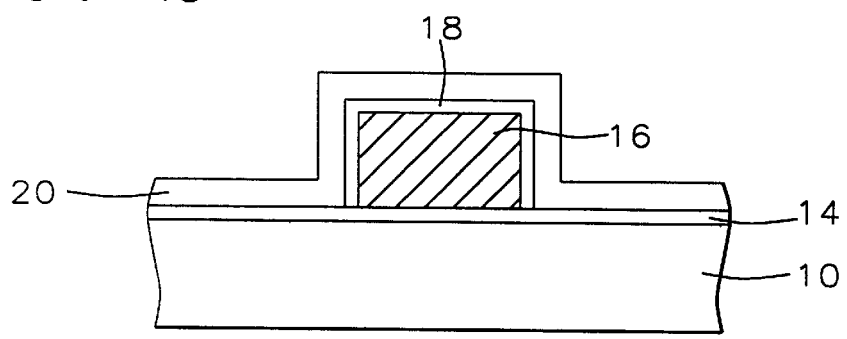
FIG. 3

METHOD AND A DEEP SUB-MICRON FIELD EFFECT TRANSISTOR STRUCTURE FOR SUPPRESSING SHORT CHANNEL EFFECTS

This is a division of patent application Ser. No. 08/990,698, filing date Dec. 15, 1997, now U.S. Pat. No. 5,989,966. A Method And A Deep Sub-Micron Field Effect Transistor Structure For Suppressing Short Channel Effect, assigned to the same assignee as the present invention.

BACKGROUND OF THE INVENTION (1) Field of the Invention

The present invention relates to the fabrication of integrated circuit devices on semiconductor substrates, and more particularly relates to field effect transistors having deep sub-micron channel lengths with reduced gate-to-drain capacitance and improved short channel effects.

(2) Description of the Prior Art

Advances in the semiconductor process technologies in the past few years have dramatically decreased the device feature sizes and increased the circuit density and performance on integrated circuit chips. The device most used for Ultra Large Scale Integration (ULSI) is the Field Effect Transistor (FET), having a silicon gate electrode with self-aligned source/drain contact areas. The popular choice of FETs is because of their very small size, high packing density, low power consumption, and high yields.

The conventional FETs are typically fabricated by patterning polysilicon gate electrodes over a thin gate oxide on a single-crystal semiconductor substrate. The gate electrode structure is used as a diffusion or implant barrier mask to form self-aligned source/drain areas in the substrate adjacent to the sides of the gate electrode. The distance from the source junction to drain. junction under the gate electrode is defined as the channel length of the FET.

Advances in semiconductor technologies, such as high-resolution photolithographic techniques and anisotropic plasma etching, to name a few, have reduced the minimum feature sizes of devices to much less than a micrometer (um or $1.0 \times 10^{-4}$ centimeters, commonly referred to as a micron). For example, in the industry FETs are currently used having channel lengths that are less than a half-micrometer (about 0.35 um) in length. If further increases in circuit density and device performance are to continue, then device minimum feature sizes, and more specifically the FET channel length, must be reduced to deep sub-micron dimensions (that is, to less than 0.20 um).

However, as this downscaling continues and the channel length is further reduced in length, the FET device experiences a number of undesirable electrical characteristics known as short channel effects (SCE). These short channel effects become more severe as the device physical dimensions and, more specifically, as the FET channel length is scaled down. This result is due to the fact that the band gap and built-in potential at junctions are an intrinsic property (constant) of the crystalline materials (such as silicon), and are non-scalable with the further reduction in device dimensions.

These adverse short channel effects result from the electric field distribution in the channel area when the integrated circuit is powered up, which lead to a number of problems. For example, electrons ejected from the drain can acquire sufficient energy to be injected into the gate oxide resulting in charge buildup in the oxide that causes threshold voltage shifts. Unfortunately, this hot carrier effect (HCE) can degrade device performance after the product is in use (at the customer).

One method of minimizing these short channel effects, common practice in the semiconductor industry, is to fabricate FET structures with Lightly Doped Drains (LDDs). These LDD FET structures have low dopant concentration in the drain regions adjacent to the gate electrodes, and modify the electric fields in the drains so as to minimize or eliminate short channel effects, such as hot carrier effects.

Typically, the LDD FETs are formed by using two ion implantations. After forming the polysilicon gate electrodes, a first implant, using the gate electrodes as an implant mask, is carried out to form lightly doped source/drain regions adjacent to the gate electrodes. Sidewall spacers are then formed on the gate electrodes and a second implant is used to form the heavily doped source/drain regions.

Another method by the prior art is to form the lightly doped drains (actually source/drain areas) by solid-phase diffusion from a doped oxide source that is also used as the sidewall spacers. This is best understood by referring to FIG. 1 of the prior. In this FET structure a gate oxide 14 is grown by thermal oxidation on the device area of the substrate 10, and a polysilicon,n layer is deposited and patterned to form the FET gate electrode 16. Doped sidewall spacers 20 are formed by depositing a doped oxide (e.g., phosphosilicate glass (PSG)) and anisotropically etching back to the substrate 10. After implanting the source/drain contact areas 24($N^+$), the substrate is annealed to drive in the dopant to form the lightly doped source/drain areas 26($N^-$) and to activate and anneal out the implant damage in the $N^+$ source/drain contact areas. For an FET with a 0.2 um gate width, the effective channel length is only about 0.1 um. Unfortunately, in this process and structure, the gate electrodes 16 significantly overlay the outdiffused lightly doped source/drain regions 26($N^-$) resulting in high gate-to-drain capacitance that degrades the RC delay time. For example, when the gate electrode length is 0.2 um, the outdiffusion of the dopant from the sidewall spacers 20 can result in an effective FET channel length of only 0.1 um. Also, the Lightly doped source/drain areas 26($N^-$) extending significantly under the gate electrodes results in unwanted short channel effects, such as hot carrier injection in the gate oxide 14.

Other related references include U.S. Pat. No. 4,960,723 to Davies in which a method is taught for making self-aligned vertical FETs having an improved source contact. The source contact in the second embodiment is formed by outdiffusing from a doped oxide, but does not address the gate-to-drain overlay capacitance described above. Kurimoto et al. in U.S. Pat. No. 5,221,632 describe a method using two sidewall spacers. A first sidewall spacer composed of a material having a high dielectric constant, such as polysilicon, is used to suppress hot electron degradation by reducing the horizontal electric field around the drain. Still another approach is described by Gonzalez in U.S. Pat. No. 5,312,768 in which alternative methods of making raised source/drain areas that avoid using epitaxy and high current source/drain implants to minimize short channel effects are described. In U.S. Pat. No. 5,496,750, Moslehi teaches a method of making elevated source/drain junctions using a polysilicon layer which is implanted and subjected to an anneal to form heavily doped shallow source/drain junction regions. However, Moslehi uses conventional ion implantation to form the lightly doped drain or LDD junctions. Another approach is described in U.S. Pat. No. 5,641,698 to Lin in which polysilicon sidewalls are used to improve hot carrier immunity. However, the method uses ion implantation to form the lightly doped source/drain regions but does not use a solid-phase diffusion spacer to form the LDDs.

However, the prior-art methods described above, which use solid-phase diffusion spacers to form the LDDs, generally have high gate-to-drain capacitance. Therefore, there is still a strong need in the semiconductor industry to form FETs having shallow lightly doped drains using solid-phase diffusion spacers to provide short channel effect suppression and low gate-to-drain capacitance, while maintaining a cost-effective manufacturing process.

SUMMARY OF THE INVENTION

It is a principal object of this invention to provide an improved sub-micrometer field effect transistor with improved short channel effect suppression (reduced hot carrier effects) to optimize the drive current.

It is another object of this invention to provide reduced control gate-to-drain capacitance to reduced the RC time delays and improved circuit performance.

It is still another object in a second embodiment of this invention to provide a process for forming both N-channel and P-channel FETs for Complementary Metal Oxide Semiconductor (CMOS) circuit applications while providing a cost-effective manufacturing process.

In accordance with the above objects of a first embodiment, a method for fabricating improved deep sub-micrometer FETs, for example, having channel lengths that are about 0.2 um, is achieved.

The method for forming these improved FETs begins by providing a single-crystal semiconductor substrate having device areas that are typically surrounded and electrically isolated by field oxide areas. The devices utilize a double sidewall spacer and a solid-phase diffusion from a second sidewall spacer to make lightly doped source/drain areas. The field oxide is a relatively thick oxide formed by conventional means as is well known in the! industry, such as the LOCal Oxidation of Silicon (LOCOS) or Shallow Trench Isolation (STI). The method is described for an N-channel FET on a substrate that is doped with a first conductive type dopant, such as a P-type dopant (boron), and gate electrodes and source/drain areas formed using an N-type second conductive dopant such as arsenic (As) or phosphorus (P). However, it should be understood that by reversing the polarity of the dopants, P-channel FETs can also be formed with these improved short channel effect characteristics.

A gate oxide layer is formed, typically by thermal oxidation, on the device areas. A polysilicon layer doped with the second conductive type dopant, such as an N-type dopant (arsenic (As)) is deposited on the substrate and over the gate oxide layer. The polysilicon layer is patterned to form gate electrodes over the device areas. A silicon nitride layer is conformally deposited over the gate electrodes and is anisotropically etched back to form first sidewall spacers on the sidewalls of the gate electrodes. The sidewall nitride spacers also serve as a diffusion barrier. The gate oxide on the exposed device areas adjacent to the first sidewall spacers is then selectively removed using a dilute hydrofluoric acid dip etch. A conformal diffusion layer doped with the second conductive type dopant (N-type) is deposited on the substrate and over the gate electrodes. The diffusion layer is preferably a doped glass, such as phosphosilicate glass (PSG), or an in-situ phosphorus-doped polysilicon layer. The diffusion layer is anisotropically etched back to form second sidewall spacers on the first sidewall spacers and later will serve as the diffusion source for making the lightly doped source/drain areas adjacent to the gate electrodes. Heavily doped source/drain contact areas are formed next by ion implanting a dopant of the second conductive type dopant (N-type, such as arsenic or phosphorus) in the device areas adjacent to the gate electrodes. The substrate is then annealed to diffuse the N-type dopant from the second sidewall spacers to form lightly doped source/drain areas under the first sidewall spacers contiguous with the FET channels, but with minimum overlay capacitance with the gate electrodes. The first sidewall spacers composed of silicon nitride serve as a barrier to the solid-phase diffusion of the dopant from the second sidewall spacers. The same annealing step also serves to electrically activate the implanted dopant and to anneal out implant damage in the source/drain areas.

In a second embodiment, a method is described for making concurrently P-channel and N-channel FETs for CMOS circuits using these improved FETs. Briefly, the method involves forming a P- and an N-well in the substrate on which the N-channel and P-channel FETs, respectively, are formed. After forming the first sidewall spacers from silicon nitride and the N-doped second sidewall spacers on the FET gate electrodes, a first photoresist mask, which serves as an implant blockout mask, is used to mask the P-channel FETs while implanting the $N_+$ source/drain regions for the N-channel FETs. After the first photoresist mask is removed, a second photoresist mask is used. to selectively remove the N-doped second sidewall spacers from the P-channel FETs, and P-doped third sidewall spacers are formed on the FETs. A third photoresist mask is used as a blockout mask to protect the N-channel FETs while implanting the P-doped source/drain areas for the P-channel FETS. After removing the third photoresist mask, the substrate is annealed to concurrently form the lightly doped source/drain areas for the N- and P-channel FETs, and to electrically activate the implanted dopant in the source/drain areas of both types of FETs, and to anneal out any ion implant damage.

BRIEF DESCRIPTION OF THE DRAWINGS

The object and other advantages of the invention will become more apparent in the preferred embodiments when read in conjunction with the following drawings.

FIG. 1 shows a schematic cross-sectional view of a prior-art FET structure having a single sidewall diffusion source for making the lightly doped source/drain areas.

FIGS. 2 through 9 show schematically in cross-sectional representation the first embodiment of the invention for fabricating improved N-channel field effect transistors having short-channel effects suppression and reduced gate/drain overlay capacitance.

DESCRIPTION OF THE PREFERRED EMBODIMENTS

Figure 4:
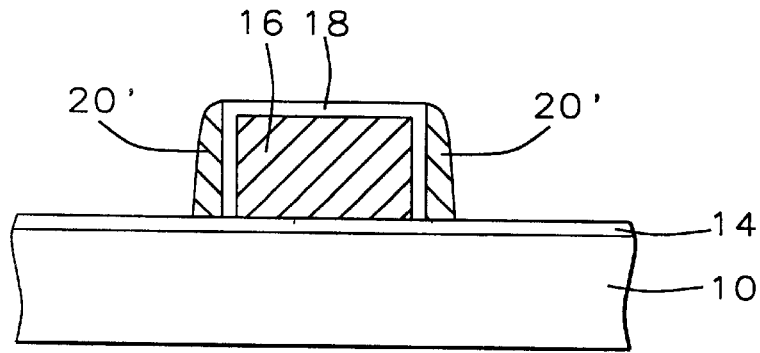

In accordance with the objects of a first embodiment, a method for forming improved deep sub-micron FETs having short channel effects suppression and reduced gate/drain overlay capacitance is described in detail. The method for the first embodiment is described for making N-channel FETs using first and second conductive type dopants, but it should be well understood by one skilled in the art that by reversing the polarity of the dopants, P-channel FETs can be made. Further, by including additional photoresist masking steps, the N-channel and P-channel FETs can be formed concurrently on the same substrate for CMOS circuit applications, as described in a second embodiment. Also, the device areas on the substrate are typically surrounded and electrically isolated by a relatively thick field oxide. The field oxide is not show to simplify the drawings and the discussion, but is generally formed by conventional means as is well known in the industry, such as the LOCal Oxidation of Silicon (LOCOS) or Shallow Trench Isolation (STI).

Referring to FIG. 2, a portion of a device area on a substrate 10 is shown. The substrate 10 is typically a single-crystal silicon doped with a first conductive type dopant, such as boron (B). A gate oxide 14 is grown on the device areas by thermal oxidation to a thickness of between about 20 and 70 Angstroms. A polysilicon layer 16 is deposited and, for N-channel FETs, is doped with an N+ second conductive type dopant. Typically the polysilicon layer 16 is deposited by low-pressure chemical vapor deposition (LPCVD) to a thickness of between about 1000 and 2000 Angstroms. Layer 16 can be doped in situ or by ion implantation with arsenic (As) or phosphorus (P) to a preferred dose of between about 1.0 E 15 and 1.0 E 16 atoms/cm$^2$. The polysilicon layer 16 is patterned to form gate electrodes 16 over the device areas. Typically during processing, a thin oxide 18 (less than 100 Angstroms) is formed on the surface of the gate electrodes 16, but is not essential to this invention.

Referring to FIG. 3, a silicon nitride ($Si_3N_4$) layer 20 is conformally deposited over the gate electrodes 16 to a thickness of between about 100 and 500 Angstroms, and more specifically to a thickness of 200 Angstroms. Layer 20 can be deposited by LPCVD using, for example, dichlorosilane ($SiCl_2H_2$) and ammonia ($NH_3$).

Referring to FIG. 4, the silicon nitride layer 20 is anisotropically etched back to form first sidewall spacers 20' on the sidewalls of the gate electrodes 16. For example, the etchback can be carried out at low pressures in a reactive ion etcher (RIE) or in a high-density plasma (HDP) etcher using a gas mixture such as carbon tetra-fluoride ($CF_4$) and hydrogen ($H_2$).

Figure 5:
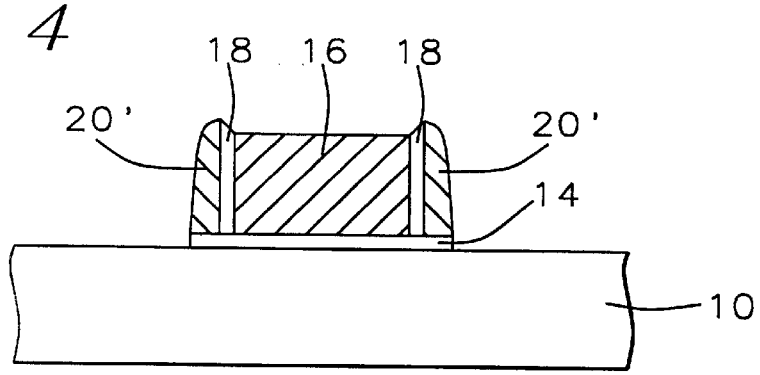

Referring next to FIG. 5, the gate oxide 14 is selectively removed from the exposed device areas on the substrate 10 adjacent to the first sidewall spacers 20'. For example, the gate oxide 14 can be removed by dip etching using a dilute solution of hydrofluoric (HF) acid and water.

Figure 6:
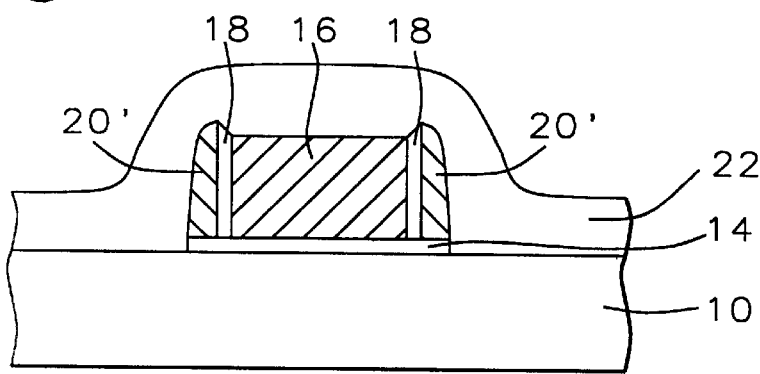

Referring now to FIG. 6, a diffusion layer 22, doped with an N-type second conductive dopant such as phosphorus, is conformally deposited over the gate electrodes 16. For example, the preferred diffusion layer is a doped glass, such as phosphosilicate glass (PSG). Alternatively, an in-situ phosphorus-doped polysilicon layer can also be used. The PSG is preferably deposited by LPCVD using tetraethosiloxane (TEOS) as the reactant gas and phosphine ($PH_3$) as the dopant gas. When a doped polysilicon layer is used for layer 22, then layer 22 can be deposited by LPCVD using silane ($SiH_4$) and a dopant gas of phosphine ($PH_3$). Layer 22 is preferably deposited to a thickness of between about 500 and 1000 Angstroms.

Figure 7:
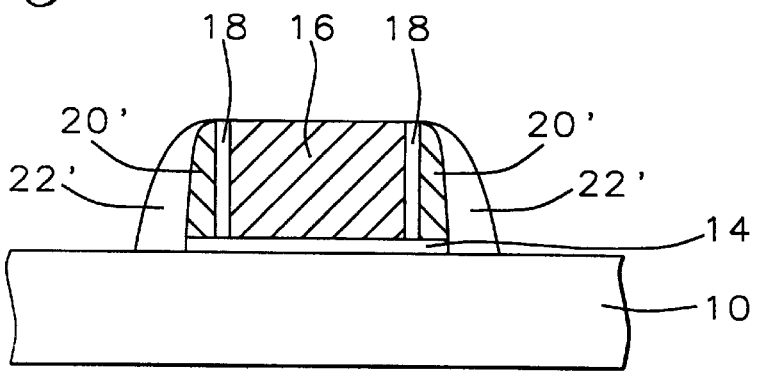

Referring to FIG. 7, the diffusion layer 22 is anisotropically etched back to form second sidewall spacers 22' on the first sidewall spacers 20'. The second sidewall spacers 22' are later used as a solid-phase diffusion source for forming the N-channel FET lightly doped source/drain areas adjacent to the gate electrodes 16.

Figure 8:
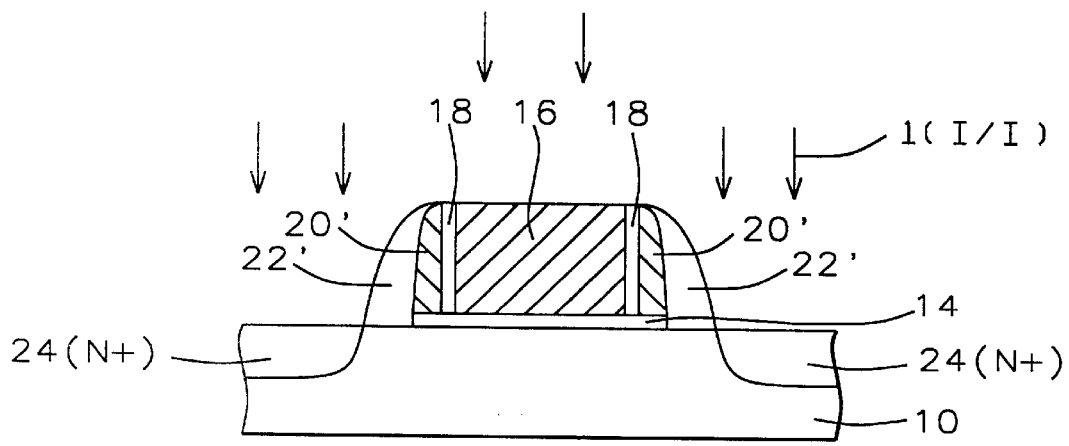

Referring now to FIG. 8, the heavily doped source/drain contact areas 24(N+) are formed next by ion implanting a dopant such as arsenic ($As^{75}$) or phosphorus ($p^{31}$) using the gate electrodes 16 and the sidewall spacers 20' and 22' as an implant mask to self-align the source/drain areas 24(N+) to the second sidewall spacers 22'. Preferably the source/drain contact areas 24(N+) are implanted to provide a final concentration of between about 1.0 E 19 and 1.0 E 20 atoms/cm$^3$.

Figure 9:
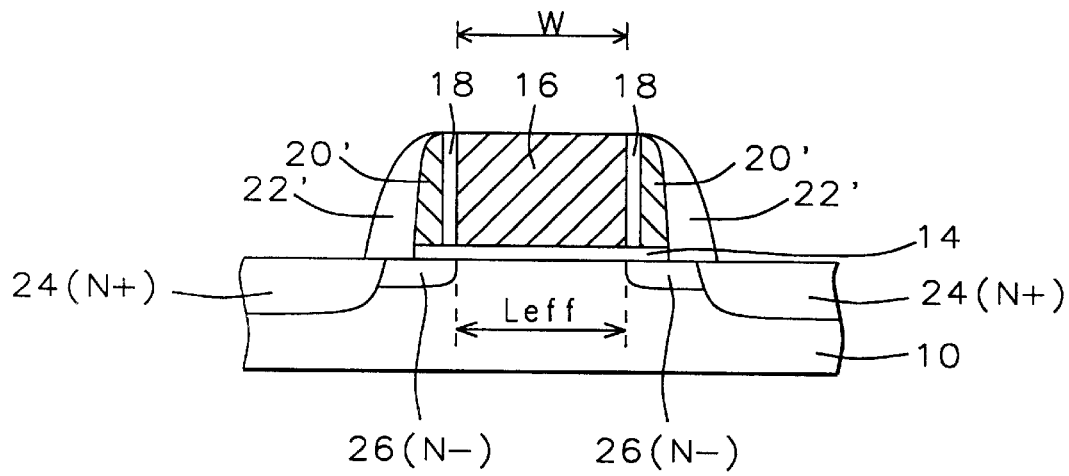

Referring to FIG. 9, the substrate 10 is then annealed to diffuse the N-type dopant from the second sidewall spacers 22' to form lightly doped source/drain areas 26(N−). Preferably the lightly doped source/drain areas 26(N−) are formed by rapid thermal anneal (RTA) at a temperature of between about 950 and 1050° C., for a time of between about 10 and 30 seconds, and more particularly the anneal can be carried out at a temperature of 1000° C. for a time of about 20 seconds. A key feature of this inventions is that the first sidewall spacers 20' formed from $Si_3N_4$ serve as a diffusion barrier, and the second sidewall spacers 22' serve as a solid-phase diffusion source to form the lightly doped source/drain areas 26(N−). This novel structure results in minimizing the gate electrode 16-to-drain 26(N−) overlay capacitance which improves device performance and minimizes the short channel effects, such as hot electron injection in the gate oxide. By way of example and in comparison to the prior art in FIG. 1, if the gate length W is about 0.2 um, then the first sidewall spacers 20' prevent the outdiffusion from the second sidewall spacers 22' from extending excessively into the FET channel and results in an effective channel length Leff of about 0.2 um. This trade-off reduces the gate-to-drain capacitance and modifies the electric field in the substrate to suppress the short-channel effects. The same annealing step also electrically activates the implanted dopant in the source/drain contact region 24(N+) and anneals out any implant damage.

Referring to FIGS. 10 through 17, a second embodiment is described for making concurrently P-channel and N-channel FETs for Complementary Metal Oxide Semiconductor (CMOS) circuits using these improved FETs.

Figure 10:
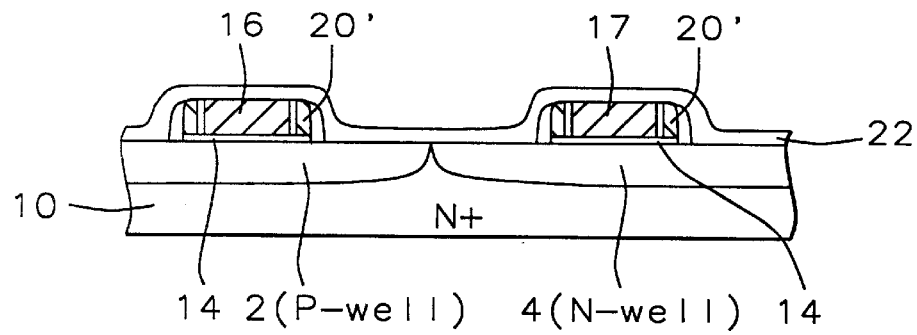
FIGS. 10 through 17 show schematically in cross-sectional representation the second embodiment of the invention for fabricating these improved N- and P-channel FETs formed on the same substrate for CMOS circuits.
Figure 11:
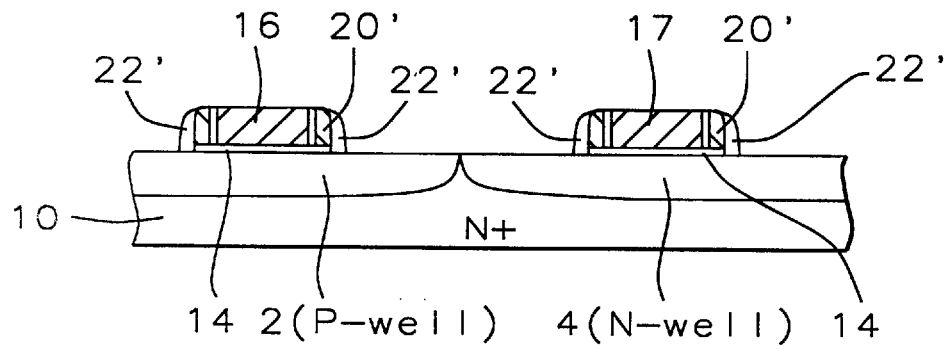

Referring to FIG. 10, the P-channel and N-channel FETs can be formed concurrently for CMOS circuits by first forming P-well regions 2 and N-well regions 4, respectively, in the substrate 10 for the N-channel and P-channel FETs, hereafter referred to as N-FETs and P-FETs. Because the process is similar to the first embodiment, only the additional processing steps and additional structure elements will be described in detail. The method starts out similar to the first embodiment by forming a gate oxide 14 on the device areas over the P- and N-wells. The polysilicon layer 16 is then patterned to form gate electrodes 16 over the P-wells 2 for the N-FETs and over the N-wells 4 to form gate electrodes 17 for the P-FETS. The $Si_3N_4$ first sidewall spacers 20' are formed next by depositing and etching back a $Si_3N_4$ layer. Similar to the first embodiment, the gate oxide 14 is removed adjacent to the $Si_3N_4$ sidewall spacers 20' using a dip etch in a dilute HF solution and the N-doped diffusion layer 22 is deposited. Layer 22 is then etched back to form the second sidewall spacers 22' for the N-FETs, as shown in FIG. 11. The second sidewall spacers 22' are preferably composed of a phosphosilicate glass (PSG) and are formed similar to the first embodiment.

Figure 12:
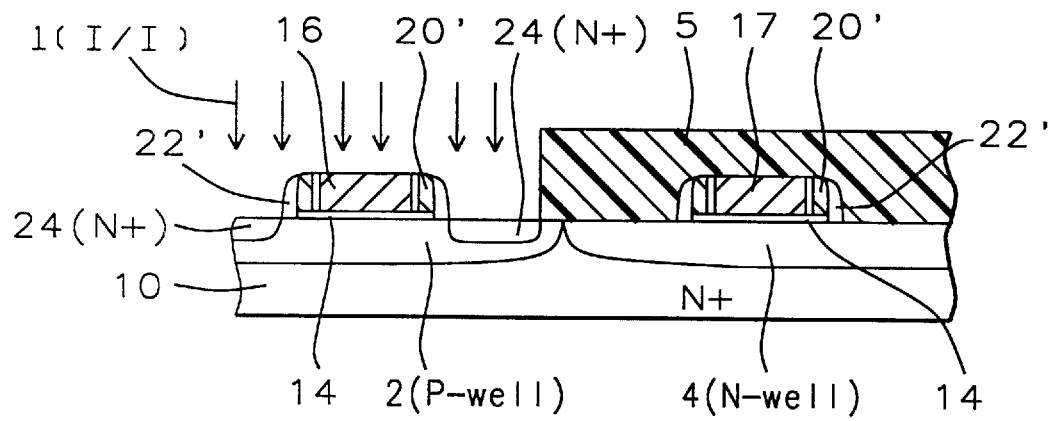

Referring to FIG. 12, a first photoresist masking layer 5 is formed over the N-wells 4 to serve as an implant blockout mask to prevent implanting in the N-wells. An ion implantation is then carried out to form the source/drain contact areas 24(N+) for the N-FETs formed on and in the P-wells 2, and also to dope the N-FET gate electrodes 16. The gate electrodes 16 and the first and second sidewall spacers 20' and 22' serve as a blockout mask to self-align the source/drain areas 24(N⁺) to the gate electrode 16. The preferred ion implantation is arsenic ions (As$^{75}$) and the process is similar to the first embodiment.

Figure 13:
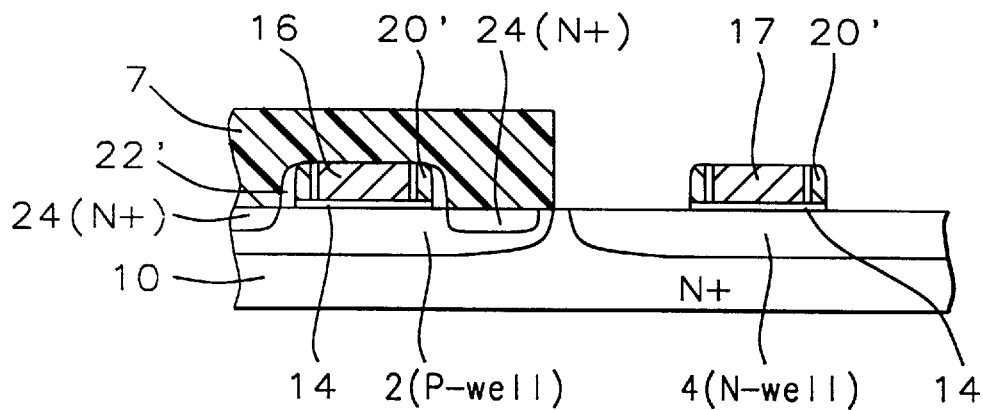

Referring now to FIG. 13, the first photoresist mask 5 is removed, and a second photoresist mask 7 is used to protect the N-FET gate electrodes 16. The PSG second sidewall spacers 22' are then selectively removed from the gate electrodes 17 for the P-FETs using a dip etch, such as in a dilute HF acid solution.

Figure 14:
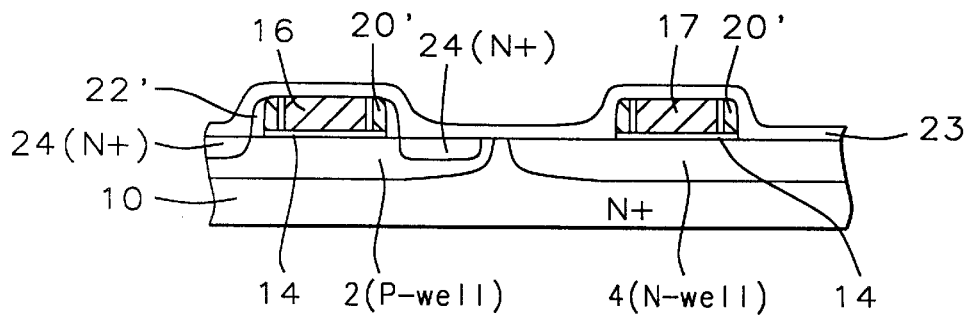

Referring to FIG. 14, the second photoresist mask 7 is removed and a second conformal P-doped diffusion layer 23 is deposited. Diffusion layer 23 is preferably a borosilicate glass (BSG) deposited by LPCVD using TEOS and a dopant gas such as diborane hydride ($B_2H_6$). Layer 23 is deposited to a preferred thickness of between about 500 and 1000 Angstroms. Alternatively, a P-doped polysilicon Layer can be used for layer 23.

Figure 15:
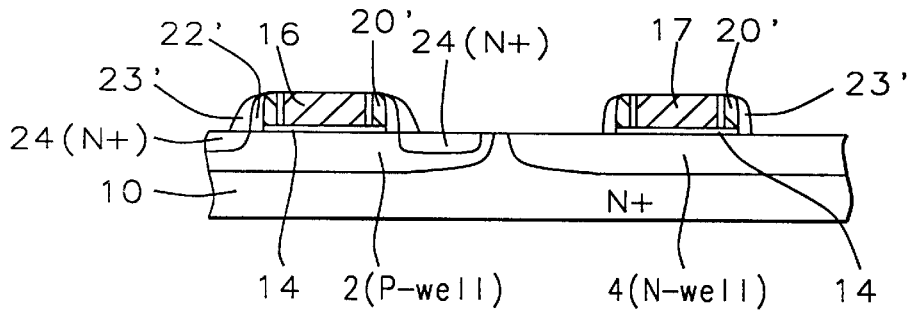

Referring to FIG. 15, BSG layer 23 is anisotropically etched back to form P-doped third sidewall spacers 23' on the gate electrodes 17 of the P-FETs, while portions of layer 23 remain over the second sidewall spacers 22' on the gate electrodes 16 for the N-FETs.

Figure 16:
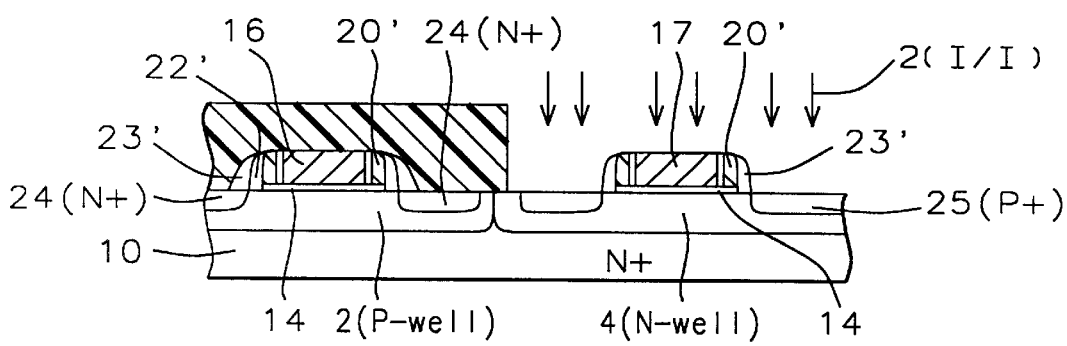

Referring to FIG. 16, a third photoresist mask 9 is used as a blockout mask to protect the N-FETs when ion implanting the P-doped source/drain contact areas 25(P⁺) for the P-FETs, while doping the polysilicon cate electrodes 17. Preferably, the ion implantation is carried out using boron ions ($B^{11}$).

Figure 17:
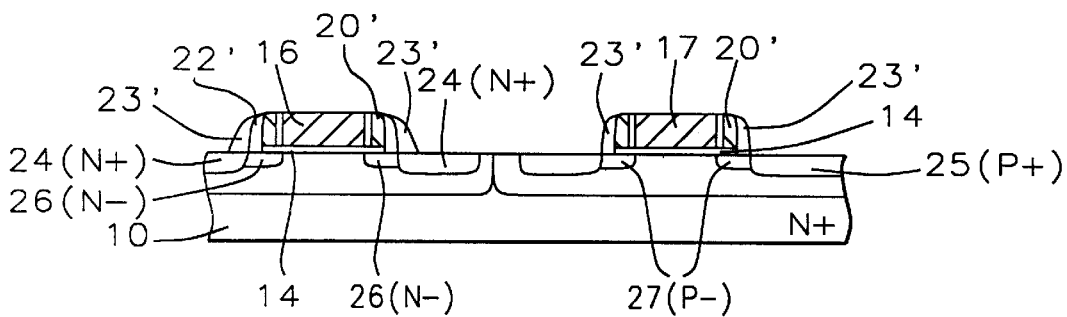

Referring to FIG. 17, the N-FETs and P-FETs for forming CMOS circuits are now completed by removing the third photoresist mask 9 and by annealing the substrate 10 to concurrently form the lightly doped source/drain areas 26(N⁻) for the N-FETs and to form the lightly doped source/drain areas 27(P⁻) for the P-FETs. The anneal also electrically activates the implanted dopants in the source/drain contact areas 24(N⁺) for the N-FETs and for the source/drain contact areas 25(P⁺) for the P-FETs. Further, any ion implant damage in the source/drain contact areas is annealed out. After annealing, the preferred dopant concentration of the lightly doped source/drain areas 26(N⁻) is between about 1.0 E 17 and 1.0 E 18 atoms/cm³, and the preferred dopant concentration of the lightly doped source/drain areas 27(P⁻) is between about 1.0 E 17 and 1.0 E 18 atoms/cm³. The N⁺ and P⁺ source/drain contact areas 24 and 25, respectively, are typically doped to a concentration of between about 1.0 E 19 and 1.0 E 20 atoms/cm³.

The process results in the improved FETS, as described in the first embodiment, having reduced gate-to-drain overlay capacitance and suppressed short channel effects.

While the invention has been particularly shown and described with reference to the preferred embodiments thereof, it will be understood by those skilled in the art that various changes in form and details may be made without departing from the spirit and scope of the invention. For example, by reversing the polarity of the first and second conductive type dopants and appropriately selecting the dopant concentrations, it is possible to fabricate a P⁻channel FET by the same invention.

What is claimed is:

1. An improved field effect transistor (FET) with diffused lightly doped source/drain areas comprised of:
    a semiconductor substrate doped with a first conductive type dopant and having field oxide areas on said semiconductor substrate surrounding and electrically isolating device areas;
    a gate oxide layer on said device areas;
    a polysilicon layer doped with a second conductive type dopant on s aid substrate and over said gate oxide and said polysilicon layer patterned to form gate electrodes on said device areas;
    first sidewall spacers composed of silicon nitride on sidewalls of said gate electrodes and on said gate oxide;
    second sidewall spacers formed from a doped glass as a diffusion layer doped with said second conductive type dopant one said first sidewall spacers and contacting said substrate adjacent to said first sidewall spacers;
    doped source/drain areas adjacent to said second sidewall spacers formed by ion implantation of said second conductive type dopant;
    lightly doped source/drain areas under said first sidewall spacers and contiguous with the channels of said FETs formed by diffusion of said second conductive type dopant from said second sidewall spacers.

2. The field effect transistor of claim 1, wherein said first conductive type dopant is boron, and said second conductive type dopant is phosphorus, thereby forming N-channel FETs.

3. The field effect transistor of claim 1, wherein said first conductive type dopant is phosphorus, and said second conductive type dopant is boron, thereby forming P-channel FETs.

* * * * *